(12) United States Patent
Lippok

(10) Patent No.: US 9,241,424 B2
(45) Date of Patent: Jan. 19, 2016

(54) ELECTRONIC DEVICE HAVING A HOUSING MADE OF PROFILE MATERIAL

(75) Inventor: Ralf Lippok, Backnang (DE)

(73) Assignee: Robert Bosch GmbH, Stuttgart (DE)

( * ) Notice: Subject to any disclaimer, the term of this patent is extended or adjusted under 35 U.S.C. 154(b) by 423 days.

(21) Appl. No.: 13/805,642

(22) PCT Filed: Jun. 1, 2011

(86) PCT No.: PCT/EP2011/059043
§ 371 (c)(1),
(2), (4) Date: Apr. 8, 2013

(87) PCT Pub. No.: WO2011/160929
PCT Pub. Date: Dec. 29, 2011

(65) Prior Publication Data
US 2013/0208425 A1     Aug. 15, 2013

(30) Foreign Application Priority Data

Jun. 24, 2010   (DE) .......................... 10 2010 030 460

(51) Int. Cl.
*H05K 7/20*     (2006.01)
*H05K 5/00*     (2006.01)

(52) U.S. Cl.
CPC .......... *H05K 7/20445* (2013.01); *H05K 5/0026* (2013.01); *H05K 7/20854* (2013.01)

(58) Field of Classification Search
CPC ............ H05K 5/0026; H05K 7/20445; H05K 7/20854
USPC ..................... 361/714; 174/50.52, 50.53, 527
See application file for complete search history.

(56) References Cited

U.S. PATENT DOCUMENTS

| | | | |
|---|---|---|---|
| 6,778,388 B1 * | 8/2004 | Minelli | 361/690 |
| 7,286,360 B2 * | 10/2007 | Sohn | 361/704 |
| 2006/0232940 A1 | 10/2006 | Smirra et al. | |

FOREIGN PATENT DOCUMENTS

| | | |
|---|---|---|
| DE | 103 34 060 B3 | 4/2005 |
| EP | 2 175 708 A1 | 4/2010 |
| WO | 2004/036972 A1 | 4/2004 |

OTHER PUBLICATIONS

International Search Report corresponding to PCT Application No. PCT/EP2011/059043, mailed Jul. 27, 2011 (German and English language document) (7 pages).
Villevieille, J.M. et al., "Optimized Angled Housing Design", Motorola Technical Developments, Motorola Inc., Schaumburg, Illinois, vol. 16, pp. 83-84, Aug. 1, 1992, XP000310367.

* cited by examiner

*Primary Examiner* — Tuan T Dinh
*Assistant Examiner* — Mukund G Patel
(74) *Attorney, Agent, or Firm* — Maginot, Moore & Beck LLP

(57) ABSTRACT

The disclosure relates to an electronic device comprising an insertion housing produced from a profile element having a closed cross-section and including a first opening and a second opening, a circuit board having at least one electronic component, and a first closure element. The first closure element is disposed at the first opening, and the first opening lies in a plane at an angle to a direction of insertion of the circuit board.

7 Claims, 1 Drawing Sheet

ELECTRONIC DEVICE HAVING A HOUSING MADE OF PROFILE MATERIAL

This application is a 35 U.S.C. §371 National Stage Application of PCT/EP2011/059043, filed on Jun. 1, 2011, which claims the benefit of priority to Serial No. DE 10 2010 030 460.3, filed on Jun. 24, 2010 in Germany, the disclosures of which are incorporated herein by reference in their entirety.

BACKGROUND

The present disclosure relates to an electronic device having a closed housing made from a profile material, e.g. an extruded section, from which the housing is separated.

Electronic devices are used in a plurality of applications. For example, engine control devices or other control devices that are conventionally of a shell structure are used in vehicles. In the case of this shell structure, an interconnect device, e.g. a circuit board, having electronic/electrical components is arranged in a first housing half shell and closed by means of a second housing half shell. In so doing, prior to the step of closing said shell, it is also possible, if necessary, to perform assembly tasks or other work on the circuit board, since the circuit board is freely open and can be worked on from above without any problem. Since heat is generated in known electronic devices during operation, conventional solutions for cooling the electrical devices are installed during assembly. In addition to using ventilation for cooling purposes, it is also possible to connect the electronic components directly to one of the housing half shells by way of a heat conducting element. Since the interconnect device is easily accessible in the case of the shell-like housing, the electronic components can be contacted directly in a particularly cost-effective manner. However, with respect to further cost savings, it would be desirable to replace the two half shells of the housing that are relatively costly to produce by a housing made from a profile element having a closed cross-section. However, in so doing, the problem arises that a circuit board that is inserted into the profile element can no longer be worked on from above if it is inserted into the housing.

SUMMARY

In contrast, the electronic/electrical device in accordance with the disclosure and having the features of claim 1 has the advantage that it comprises a housing made from a profile element having a closed cross-section and nonetheless it is possible to use extremely cost-effective methods for contacting electronic/electrical components. As a consequence, the costs for the housing can be significantly reduced by using profile elements, e.g. extruded sections. This is achieved in accordance with the disclosure by virtue of the fact that in the case of an insertion housing that comprises a first and a second opening in a direction in which a carrier component, for example a circuit board, is inserted, at least one of the two openings is provided in such a manner that the opening lies in a plane which lies at an angle that is smaller than 90° with respect to the direction in which the carrier component is inserted. In other words, at least one of the two openings in the closed profile housing is arranged in an inclined manner with respect to the direction of insertion. As a consequence, the circuit board can be inserted into the housing and it is possible to work from above in a vertical direction at least at one end region that lies on the opening provided in an inclined manner.

In so doing, the electronic device preferably comprises in addition an end piece having an integrated cooling element that is then placed on the inclined opening and closes the inclined opening. The cooling element is then connected in a heat-conducting manner to a component on the interconnect device. Consequently, heat can be discharged from the component via the heat-conducting connection to the cooling element in the end piece and from there discharged into the environment.

An angle between the direction of insertion into the closed profile housing and a plane in which the first opening lies preferably amounts to between 30° and 60° and particularly preferred amounts to 45°. This ensures sufficient stability of the closed profile element and nonetheless ensures that in the region of the opening there is a sufficiently large area that is open towards the top in the vertical direction away from the carrier component.

In accordance with a further preferred embodiment of the disclosure, the entire end piece is embodied as a cooling element. For example, the end piece can be produced completely from a heat-conducting material, in particular a metal material. It is further preferred to connect the end piece directly to the housing, so that, in addition, it is also possible to conduct heat into the housing region.

The cooling element comprises preferably one or a plurality of cooling ribs in order to dissipate heat in a particularly efficient manner.

In accordance with a further preferred embodiment of the present disclosure, a heat-conducting intermediate element is provided between the cooling element in the end piece and the electrical component. As a consequence, the electrical component can be connected directly to the cooling element in a heat-conducting manner. It is particularly preferred that the heat-conducting intermediate element comprises an electric-conducting plate and a connecting element that has elastic properties. As a consequence, it is possible to compensate for tolerances between the electronic component and the cooling element. It is particularly preferred that in so doing the elastic connecting element is a heat-conducting paste or a flexible, heat-conducting film. As a consequence, it is possible to provide a heat-conducting connection using the slug facing-up technique.

In order to achieve a particularly rapid and cost-effective assembly process, a carrier component is preferably connected directly to a second end piece, wherein the second end piece closes the second opening in the housing profile. It is particularly preferred that in so doing a plug-in connector is provided in the second end piece, so that a simple, plug-in connection to the electronic device is possible.

In accordance with a further preferred embodiment of the present disclosure, the second opening of the profile housing is likewise cut off at an angle, so that the opening lies in a plane that is aligned at an angle with respect to the direction of insertion. As a consequence, electronic components can be provided at both ends of the carrier component, which ends can then be connected to cooling elements that are integrated into the two end pieces. These variants having two inclined openings on the profile housing are particularly suitable for electronic devices that comprise a plurality of heat-conducting, electronic components. The electronic components can then be arranged at a beginning or at an end of the carrier component.

In accordance with a further preferred embodiment of the disclosure, a plurality of electronic components are arranged on the interconnect device, which components are connected to a common cooling element in the end piece. As a consequence, in particular, an extremely simple structure can be achieved.

BRIEF DESCRIPTION OF THE DRAWINGS

A preferred exemplary embodiment of the disclosure is described in detail hereinunder with reference to the accompanying drawing, in which.

DETAILED DESCRIPTION

Figure 1:
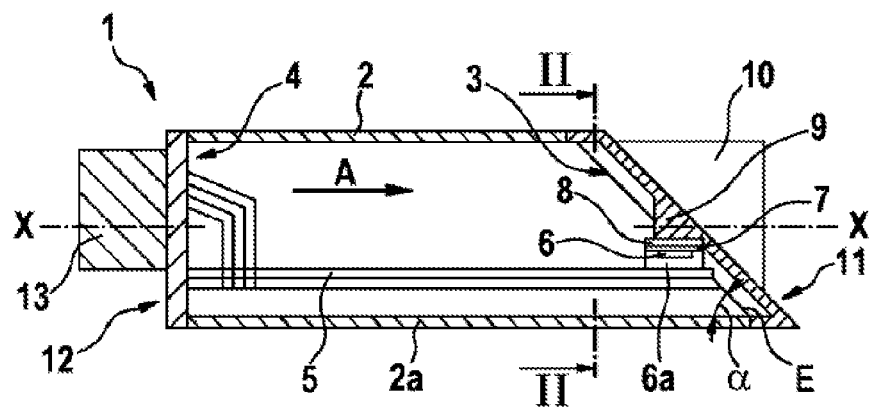
FIG. 1 shows a schematic longitudinal sectional view of an electronic device in accordance with a preferred exemplary embodiment of the disclosure.
Figure 2:
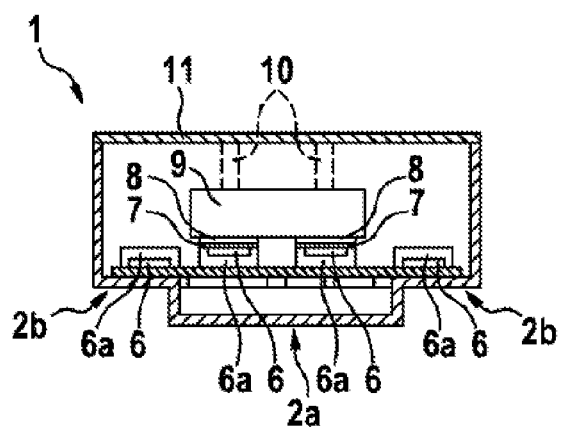
FIG. 2 shows a schematic cross-sectional view of the device illustrated in FIG. 1.

A preferred exemplary embodiment of the disclosure is described in detail hereinunder with reference to the FIGS. 1 and 2.

As is evident from FIG. 1, the electronic/electrical device 1 in accordance with the disclosure comprises a closed insertion housing 2 that is produced from a profile material. The substantially rectangular cross-section of the profile material is evident in FIG. 2, wherein an additional central, rectangular region 2a is also embodied on the lower side of the substantially rectangular profile material. A direction of insertion in which a circuit board 5 is inserted into the insertion housing 2 is indicated in FIG. 1 by the arrow A.

The insertion housing 2 comprises a first opening 3 and a second opening 4 that are arranged in each case at the ends of the insertion housing 2. In so doing, the second opening 4 is closed by means of a second end piece 12, wherein a plug-in connector 13 is arranged at the second end piece 12. In so doing, the second opening 4 is embodied in such a manner that an opening area is available perpendicular to a longitudinal axis X-X of the insertion housing. In contrast, the first opening 3 is embodied by an inclined cut end of the insertion housing 2, so that a plane E, in which the first opening 3 lies, is arranged at an angle α with respect to the longitudinal axis X-X of the insertion housing 2. The angle α in this exemplary embodiment amounts to 45° but it can be selected as desired. When making the selection, it is particularly preferred to select a range between 30 and 60° as the angle α.

In addition, electronic and/or electrical components 6 are arranged in different manners on the circuit board 5. In so doing, the two central electronic components 6 illustrated in FIG. 2 are arranged in a pad 6a that is fastened to the circuit board 5. The two outer electronic components 6 are arranged directly on the circuit board 5 and are covered in each case by a pad 6a.

As is evident from FIG. 2, in the case of the two central electronic components 6, an electrically conductive plate 7 (heat slug) is fixed on the side that is open towards the top. In addition, a connecting element 8 that has elastic properties is then fixed to the electrically conductive plate 7, which connecting element produces a connection to a cooling element 9. In so doing, the connecting element 8 is an electrically conductive paste or an electrically conductive film. Since the paste and/or the film have elastic properties, any tolerances can consequently be compensated for. The cooling element 9 is provided in the form of a cooling bank that is arranged on a first end piece 11. In so doing, the first end piece 11 closes the inclined first opening 3. In addition, two cooling ribs 10 are arranged on an outer face of the first end piece 11. These cooling ribs improve the cooling process via the cooling element 9. As is further evident from FIG. 2, the two outer electronic components 6 are cooled towards the lower face of the circuit board 5 via thermal through-going bores that are provided in the circuit board 5 and in which copper lines are arranged, wherein in so doing the lower face of the circuit board 5 lies on cooling regions 2b of the insertion housing 2. As a consequence, these electronic components 6 are sufficiently cooled.

By virtue of the idea in accordance with the disclosure of cutting off a closed profile element in an inclined manner in order to produce an insertion housing, it is possible for electronic components 6 that are arranged at an end region of the circuit board 5 and are orientated towards the first opening 3 to be worked on from above in a vertical direction. As a consequence, the so-called slug facing-up technique can be used, in which the electronic component 6 is connected from the upper side to an electrically conductive plate 7 onto which the connecting element 8 that has elastic properties is then applied. This technique is extremely cost-effective but cannot be used in the case of insertion housings in the hitherto prior art, since the insertion housings are completely closed and cover the entire circuit board, so that it has hitherto not been possible to work on the electronic components 6 from above in a vertical direction with respect to the circuit board 5. Thus, the present disclosure renders it possible, on the one hand, to use the slug facing-up technique and, on the other hand, closed profile housings can be used, which significantly reduces the production costs of electronic devices of this type. One application area for these electronic devices is, for example, the use of control devices for different applications in vehicles.

In so doing, the inclined first opening 3 is completely closed by the first end piece 11, wherein it is possible to provide a positive and/or non-positive connection between the insertion housing 2 and the first end piece 11. Other connecting techniques can also be used, for example welding or adhering techniques. Extruded sections are preferably used as the profile element for the insertion housings. If the extruded profile is symmetrical with respect to a central plane in the direction of insertion, e.g. if the extruded profile is rectangular and the angle α in which the opening area is arranged at the first opening 3 amounts to 45°, it is also possible that in each case similar insertion housings 2 are cut from the extruded section, since it is only necessary for every second insertion housing that has been cut to be rotated by 180° and it can then be used in the same manner.

In addition, it is possible in accordance with the disclosure that insertion housings that are of different lengths in the axial direction are also cut from an extruded section, so that a high level of flexibility in production is achieved with respect to the length of the insertion housings.

It is to be further noted that naturally the two openings 3, 4 can also be cut at an angle from the profile element, so that electronic components 6 can be worked on from above in a vertical direction at both ends of the circuit board 5.

In addition, the present disclosure renders it possible for the electronic components 6 to be contacted directly from above by means of an end piece. As a consequence, insertion housings 2 produced from profile elements can be used and the electronic components that lie on an end of the circuit board 5 can be contacted directly by a cooling element 9 that is integrated in the end piece 11. This renders it possible to discharge heat in a particularly efficient manner. Consequently, the present disclosure is particularly suitable in applications in which the electronic components discharge a relatively large amount of heat.

In so doing, the two end pieces 11, 12 are preferably embodied in such a manner that they can be plugged onto the insertion housing 2.

The invention claimed is:

1. An electronic device comprising:
   an insertion housing that is produced from a profile element having a closed cross-section and that includes a first opening and a second opening arranged at opposite ends of the housing;
   a circuit board extending longitudinally within the housing between the first and second openings and having at least one electronic component; and
   a first end piece arranged on the first opening,
   wherein the first opening lies in a plane which is arranged at an angle that is smaller than 90° with respect to a direction in which the circuit board is inserted into the insertion housing,
   wherein the first end piece includes a cooling element that is connected in a heat-conducting manner to the electronic component,
   wherein at least one heat-conducting intermediate element is arranged between the electronic component and the cooling element, and
   wherein the heat-conducting intermediate element includes an electrically conductive plate, the electrically conductive plate being arranged directly on the electronic component and including a connecting element having elastic properties that connects the electrically conductive plate to the cooling element.

2. The electronic device as claimed in claim 1, wherein the angle preferably lies between 30° and 60° and particularly preferred is 45°.

3. The electronic device as claimed in claim 1, wherein the entire end piece is embodied as the cooling element.

4. The electronic device as claimed in claim 1, wherein the cooling element of the end piece is connected directly to the insertion housing.

5. The electronic device as claimed in claim 1, wherein cooling ribs are provided on the end piece.

6. The electronic device as claimed in claim 1, wherein the connecting element that has elastic properties is a paste and/or a film.

7. The electronic device as claimed in claim 1, wherein:
   the second opening of the insertion housing is closed by a second end piece, and a plug-in connector is arranged at the second end piece and consequently an electrical connection is provided between the plug-in connector and the circuit board by virtue of the second end piece.

* * * * *